(12) United States Patent
Kobayashi

(10) Patent No.: US 12,000,862 B2
(45) Date of Patent: Jun. 4, 2024

(54) PROBE APPARATUS

(71) Applicant: HIOKI E.E. CORPORATION, Nagano (JP)

(72) Inventor: Masashi Kobayashi, Nagano (JP)

(73) Assignee: HIOKI E.E. CORPORATION, Nagano (JP)

( * ) Notice: Subject to any disclaimer, the term of this patent is extended or adjusted under 35 U.S.C. 154(b) by 457 days.

(21) Appl. No.: 17/605,101

(22) PCT Filed: Mar. 5, 2020

(86) PCT No.: PCT/JP2020/009347
§ 371 (c)(1),
(2) Date: Oct. 20, 2021

(87) PCT Pub. No.: WO2020/217729
PCT Pub. Date: Oct. 29, 2020

(65) Prior Publication Data
US 2022/0206042 A1      Jun. 30, 2022

(30) Foreign Application Priority Data
Apr. 26, 2019 (JP) ................... 2019-085595

(51) Int. Cl.
*G01R 1/00* (2006.01)
*G01R 1/067* (2006.01)

(52) U.S. Cl.
CPC ................. *G01R 1/06705* (2013.01)

(58) Field of Classification Search
CPC ................................. G01R 1/06705
See application file for complete search history.

(56) References Cited

U.S. PATENT DOCUMENTS 1,186,019 A * 6/1916 Meisel .................. B41K 3/102
101/90
5,506,515 A   4/1996 Godshalk et al.
(Continued)

FOREIGN PATENT DOCUMENTS

JP   H02-208572 A   8/1990
JP   2001-194387 A   7/2001
(Continued)

OTHER PUBLICATIONS

Japan Notice of Reasons for Refusal (including English Language Translation), dated Jan. 17, 2023, by the Japan Patent Office (JPO), in Japanese Patent Application No. 2019-085595.
(Continued)

*Primary Examiner* — Phuong Chi Thi Nguyen
(74) *Attorney, Agent, or Firm* — GREENBLUM & BERNSTEIN P.L.C.

(57) ABSTRACT

The probe apparatus has a probe (first metal plate) as a signal terminal and a probe (second metal plate) as a ground terminal. A probe holder has a holder main body formed of a conductor, clamps that are formed of a dielectric and capable of clamping the probes, and a fixing member and a male screw (or "fixture") capable of fixing both clamps, which have clamped the probes, to the holder main body. The probes are clamped by the two clamps in a state where the probes have been aligned along the plate surface direction, parts at front-end portion sides of the probes protrude from the two clamps, and the parts at front-end portion sides are capable of elastic deformation along the plate thickness direction.

20 Claims, 6 Drawing Sheets

(56) References Cited

U.S. PATENT DOCUMENTS

| | | | |
|---|---|---|---|
| 7,042,236 B1 | 5/2006 | Wollitzer | |
| 7,427,868 B2* | 9/2008 | Strid | G01R 1/06711 |
| | | | 324/755.03 |
| 7,760,072 B2* | 7/2010 | Lund | G08G 1/0962 |
| | | | 340/7.29 |
| 7,990,165 B2* | 8/2011 | Aoyagi | G01R 3/00 |
| | | | 324/754.03 |
| 8,963,570 B2* | 2/2015 | Zelder | G01R 1/06772 |
| | | | 324/755.02 |
| 2004/0189334 A1* | 9/2004 | Deng | G01R 1/06772 |
| | | | 324/755.04 |
| 2008/0186036 A1* | 8/2008 | Shumaker | G01R 1/06772 |
| | | | 324/754.01 |
| 2015/0185253 A1 | 7/2015 | Ku et al. | |

FOREIGN PATENT DOCUMENTS

| | | |
|---|---|---|
| JP | 2006-194765 A | 7/2006 |
| JP | 2011-196821 A | 10/2011 |
| JP | 2014-013196 A | 1/2014 |

OTHER PUBLICATIONS

Japan Notice of Reasons for Refusal (including English Language Translation), dated May 16, 2023, by the Japan Patent Office (JPO), in Japanese Patent Application No. 2019-085595.

International Search Report (including English Language Translation), mailed Jun. 2, 2020 by the Japan Patent Office (JPO), in International Application No. PCT/JP2020/009347.

* cited by examiner

PROBE APPARATUS

TECHNICAL FIELD

The present invention relates to a probe apparatus where a signal terminal and a ground terminal are adjacently disposed.

BACKGROUND ART

As one example, the patent literature cited below discloses the invention of a probe measurement system for measuring the electrical characteristics of an integrated circuit or an ultra-small electronic device using a high-frequency signal.

The wafer probe 20 (hereinafter also referred to as a "probe apparatus") in the probe measurement system disclosed in the cited patent literature is equipped with a semirigid coaxial cable 40 (hereinafter also referred to simply as the "coaxial cable") which includes: a copper inner conductor 41 (hereinafter also referred to simply as the "inner conductor") that has an inner conductive finger 70 soldered to a front end thereof and has an input port 30 connected to a base end; and a copper outer conductor 43 (hereinafter also referred to simply as the "outer conductor") that has outer conductive fingers 72a and 72b soldered to the front end and whose base end is connected and fixed to a primary support block 32. This wafer probe 20 uses a configuration where the inner conductive finger and the outer conductive fingers are pressed against the probed object by an elastic restoring force of the coaxial cable.

This probe apparatus is configured so that when the coaxial probe is caused to elastically deform during probing, the coaxial cable (and in more detail, a tube 148 through which the coaxial probe has been inserted) contacts a rigid support block attached below the primary support block, which limits the deformation of the coaxial cable and makes it possible to securely press the inner conductive finger and the outer conductive fingers against the probed object.

CITATION LIST

Patent Literature

Patent Literature 1
 U.S. Pat. No. 5,506,515

SUMMARY OF INVENTION

Technical Problem

However, the probe apparatus disclosed in the cited patent literature has the following problem to be solved.

In more detail, the probe apparatus disclosed in the cited patent literature is configured so that the inner conductive finger and the outer conductive fingers are pressed against the probed object by the elastic restoring force of the coaxial cable whose inner conductor is soldered to the inner conductive finger (or "signal terminal") and whose outer conductor is soldered to the outer conductive fingers (or "ground terminal"). Here, it is known that when conductors are connected together by soldering, the electrical characteristics across the two soldered conductors will change depending on factors like the amount of flux, the amount of solder material, and the temperature during the soldering process. This means that the conventional probe apparatus has a problem in that the electrical characteristics may vary depending on the environment of the soldering process that solders the inner conductive finger and the outer conductive fingers to the inner conductor and the outer conductor.

Also with the probe apparatus described above, during probing, probing pressure (that is, the force that presses the inner conductive finger and the outer conductive fingers against the probed object) acts upon the soldered portions of the inner conductive finger and the inner conductor and the soldered portions of the outer conductive fingers and the outer conductor, and as probing operations are repeated, this results in a state where it is easy for the inner conductive finger to break off the inner conductor and the outer conductive fingers to break off the outer conductor. Accordingly, the probe apparatus described above has a further problem in that the service life is short.

In addition, as described earlier, the probe apparatus described above uses a configuration where probing pressure (that is, a force for pressing both conductive fingers against the probed object) is generated by the elastic restoring force of the coaxial cable. This means that to produce an appropriate level of probing pressure, it is necessary to construct the apparatus using a coaxial cable with an appropriate suitable elastic restoring force for the probing pressure. However, it is difficult to select a coaxial cable with an appropriate elastic restoring force out of coaxial cables with superior high-frequency signal characteristics that can be used in this type of apparatus. This results in a further problem of a fall in design freedom due to the need to determine the dimensions of each element so that the appropriate level of probing pressure can be achieved in keeping with a coaxial cable that is available.

The probe apparatus described above also uses a configuration where the base end of the coaxial cable is fixed to the primary support block and to the input port attached to the primary support block, and a central portion and the front end in the length direction of the coaxial probe are not fixed at any position, so that during probing, the central portion in the length direction of the coaxial cable contacts the rigid support block, which limits the deformation. This means that with this probe apparatus, when the coaxial cable is caused to deform during probing and there is a change from a state where the central portion does not contact the rigid support block to a state where the rigid support block is contacted, there is a sudden increase in probing pressure. For this reason, the probe apparatus described above has a problem in that it is difficult to perform probing with an appropriate probing pressure.

The present invention was conceived in view of the problem described above and has a principal object of providing a probe apparatus that sufficiently reduces variations in electrical characteristics and/or probing pressure, has a sufficiently long service life, and has sufficiently high design freedom.

Solution to Problem

To achieve the stated object, the probe apparatus according to a first aspect is a probe apparatus in which a signal terminal and a ground terminal are held by a terminal holder in a state where the signal terminal and the ground terminal are adjacently disposed, the probe apparatus comprising: a first metal plate as the signal terminal; and a second metal plate as the ground terminal, wherein the terminal holder includes: a holder main body that is formed of a conductor; a pair of clamps that are formed of a dielectric and are capable of clamping the first metal plate and the second metal plate; and a fixture capable of fixing both clamps, in a state where the first metal plate and the second metal plate have been clamped, to the holder main body, the first metal plate and the second metal plate are clamped by both clamps in a state where the first metal plate and the second metal plate have been aligned along a plate surface direction, parts on front-end sides of the first metal plate and the second metal plate protrude from both clamps, and the parts on the front-end sides are capable of elastic deformation along a plate thickness direction.

In a further aspect, the fixture includes a fixing bracket formed of a conductor and at least two male threads formed of a conductor, and by screwing the male threads, which have been inserted through thread insertion portions formed in the fixing bracket, into female threads provided on the holder main body, both clamps, which have clamped the first metal plate and the second metal plate, are pressed against and fixed to the holder main body by the fixing bracket.

In a further aspect, the second metal plate is clamped between the holder main body and the fixing bracket, and the second metal plate, the holder main body, and the fixing bracket are electrically connected to each other.

In a further aspect, the fixing bracket is provided, at at least two positions, with second parts located on both sides of a first part that is placed into contact with the clamps, has a thread insertion portion formed in each second part, and a thickness, along an insertion direction of the male thread into the thread insertion portions, of third parts located between the first part and the second parts is formed thinner than a thickness of the first part along the insertion direction.

In a further aspect, a positioning concave, which is shallower than a thickness of the first metal plate and the second metal plate, is formed in at least one of the clamps, and the first metal plate and the second metal plate are fitted into and positioned by the positioning concave.

A further aspect comprises two second metal plates, with the first metal plate disposed between the two second metal plates.

Advantageous Effects of Invention

In the probe apparatus according to the first aspect, the terminal holder includes: a holder main body formed of a conductor; a pair of clamps that are formed of a dielectric and are capable of clamping a first metal plate as the signal terminal and a second metal plate as the ground terminal; and the fixture that is capable of fixing the clamps to the holder main body in a state where the first metal plate and the second metal plate are clamped. The terminal holder is configured so that the first metal plate and the second metal plate are clamped by the two clamps in a state where the first metal plate and the second metal plate have been aligned along the plate surface direction, parts on front-end sides of the first metal plate and the second metal plate protrude from the clamps, and the parts on front-end sides of the first metal plate and the second metal plate are capable of elastic deformation along the plate thickness direction.

Accordingly, since the probe apparatus is configured with no soldering at the parts of the signal terminal (the first metal plate) and the ground terminal (the second metal plate) where the probing pressure acts, it is possible to make the service life sufficiently longer, and since variations in the electrical characteristics do not occur due to differences in the amount of flux, the amount of solder material, the temperature during the soldering process, and the like, it is possible to make accurate measurements of the measured amount. Also, by changing any of the width, length, and thickness of both metal plates, it is possible to produce a structure with an elastic restoring force capable of achieving the appropriate probing pressure, which results in a sufficient improvement in design freedom. In addition, since the parts of the signal terminal (the first metal plate) and the ground terminal (the second metal plate) that elastically deform during probing do not contact the terminal holder, there is no sudden change in the elastic restoring force during elastic deformation, which means it is possible to sufficiently reduce variations in the probing pressure. As a result, it is possible to perform probing with an appropriate level of probing pressure reliably and easily.

The probe apparatus according to a further aspect is configured so that the fixture includes the fixing bracket formed of a conductor and at least two male screws that are formed of a conductor. By screwing the male screws, which have been inserted through the thread insertion portions formed in the fixing bracket, into the female threads provided in the holder main body, it is possible to press and fix the clamps, which have clamped the first metal plate and the second metal plate, onto the holder main body using the fixing bracket.

Thus, according to the probe apparatus according to a further aspect, since the holder main body and the fixing bracket can be electrically connected to each other while fixing the fixing bracket to the holder main body with the male screws without separately providing wiring or the like for connecting the holder main body and the fixing bracket to each other in order to set the holder main body and the fixing bracket at the ground potential, it is possible to sufficiently lower the assembly cost and the component cost of the probe apparatus.

Also, according to the probe apparatus according to a further aspect, the second metal plate is clamped between the holder main body and the fixing bracket, which electrically connects the second metal plate, the holder main body, and the fixing bracket to each other. This means that the fixing bracket can be fixed to the holder main body by the male screws, and the holder main body, the ground terminal (the second metal plate), and the male screws can be electrically connected to each other without separately providing wiring or the like to electrically connect the ground terminal (the second metal plate) to the holder main body and/or the fixing bracket, which makes it possible to significantly reduce the assembly cost and component cost of the probe apparatus.

Also according to the probe apparatus according to a further aspect, the fixing bracket is configured so that second parts are provided at at least two positions on both sides of the first part that is placed in contact with the clamps, the thread insertion portions are formed at both second parts, and the third parts between the first part and the second parts are formed so that the thickness along the insertion direction of the male thread into the thread insertion portions is thinner than the thickness of the first part along the insertion direction. With this configuration, the first part can be pressed against the clamp with sufficient force by the elastic restoring force of the third parts that elastically deform due to the male threads being screwed in. As a result, the signal terminal (the first metal plate) and the ground terminal (the second metal plate) can be securely clamped by both clamps, and the stacked structure composed of one of the clamps, the signal terminal (the first metal plate) and the ground terminal (the second metal plate), and the other clamp can be reliably fixed to the holder main body.

According to the probe apparatus according to a further aspect, by forming a positioning concave, which is shallower than the thickness of the first metal plate and the second metal plate, in at least one of the clamps and fitting and positioning the first metal plate and the second metal plate into the positioning concave, it is possible to favorably avoid unintended misalignment of the signal terminal (the first metal plate) and the ground terminal (the second metal plate) with respect to the clamp.

Also, according to the probe apparatus according to a further aspect, by providing two second metal plates and disposing the first metal plate between the two second metal plates, compared to a configuration with one signal terminal and one ground terminal, it is possible to shield the signal terminal using the respective ground terminals, which makes it possible to sufficiently improve the high-frequency signal characteristics of the probe apparatus.

DESCRIPTION OF EMBODIMENTS

Preferred embodiments of a probe apparatus will now be described with reference to the attached drawings.

Figure 1:
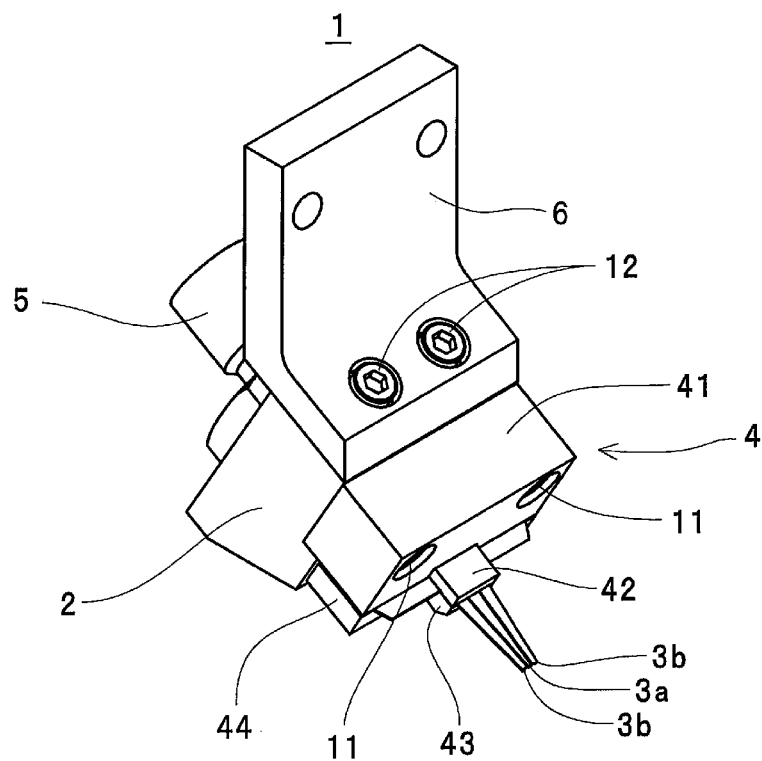
FIG. 1 is an external perspective view of a probe apparatus 1.
Figure 2:
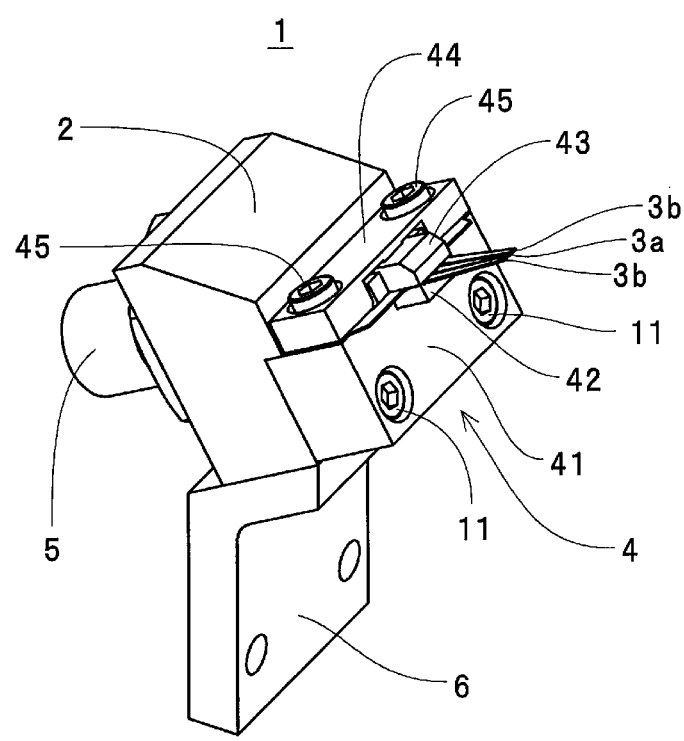
FIG. 2 is another external perspective view of the probe apparatus 1.
Figure 3:
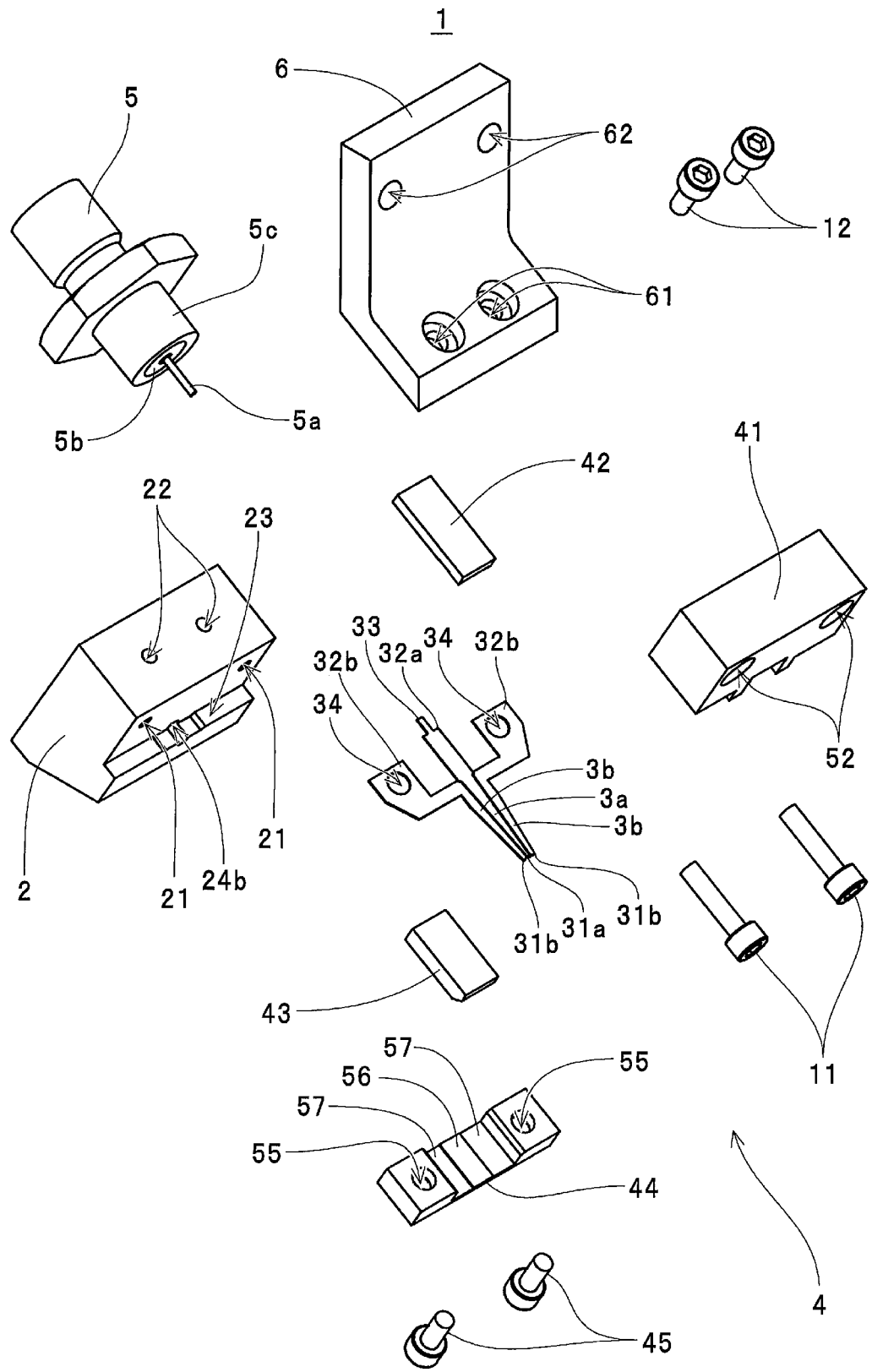
FIG. 3 is an exploded perspective view of the probe apparatus 1.

A probe apparatus 1 depicted in FIGS. 1 to 3 is one example of a "probe apparatus" according to the present invention and can be used when measuring electrical characteristics using a high-frequency signal. This probe apparatus 1 includes a base 2, probes 3a, 3b, and 3b, a probe holder 4, a connector 5, a stay 6, and male screws 11, 11, 12, and 12.

Figure 8:
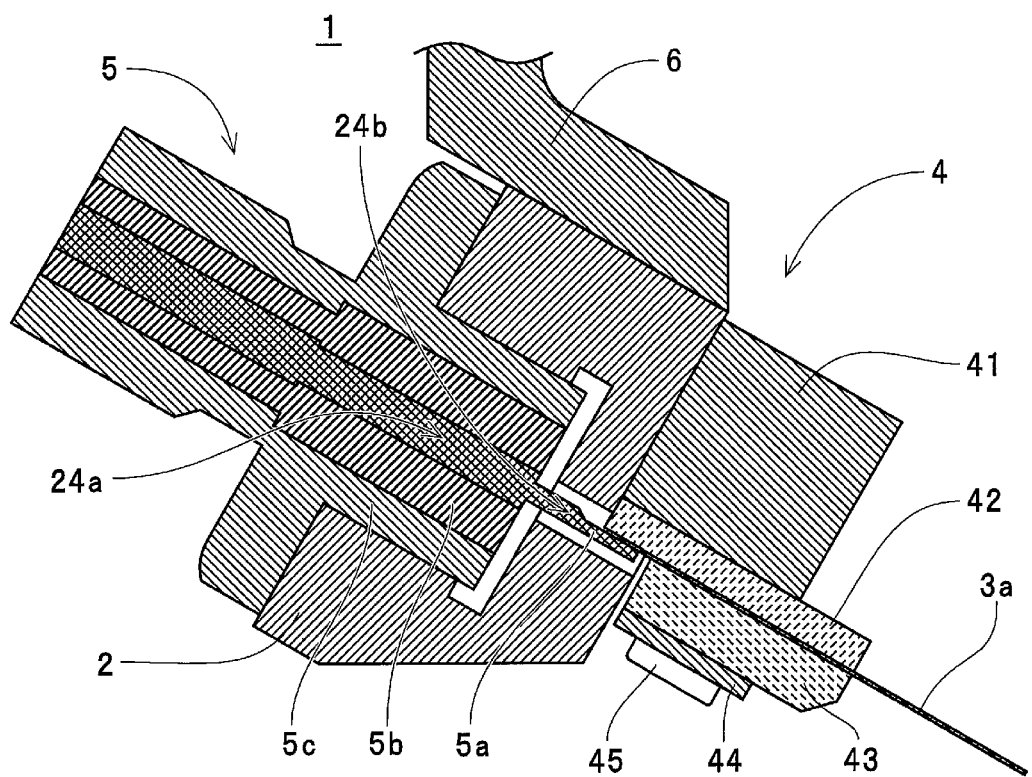
FIG. 8 is a cross-sectional view of the probe apparatus 1.

The base 2 is a housing to which the probe holder 4, the connector 5, and the stay 6 are attached, and as one example is formed of an electrical conductor, such as aluminum alloy or stainless steel. As depicted in FIG. 3, threaded holes 21, 21 into which the male screws 11, 11 for attaching the probe holder 4 can be screwed and threaded holes 22, 22 into which the male screws 12, 12 for attaching the stay 6 can be screwed are formed in the base 2. The base 2 is provided with a stepped portion 23 for restricting the attachment position of the probe holder 4 with respect to the base 2. In addition, as depicted in FIG. 8, the base 2 is formed with an attachment hole 24a for attaching the connector 5. A through hole 24b through which a contact 5a, described later, of the connector 5 can be inserted is also formed in a central portion of the attachment hole 24a.

Figure 5:
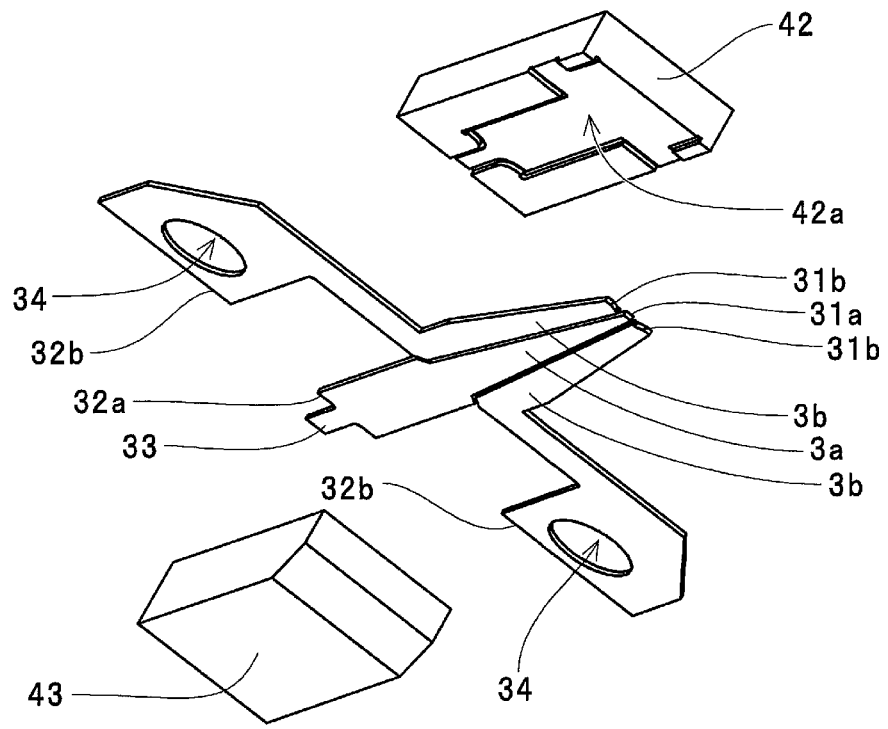
FIG. 5 is an external perspective view of probes 3a, 3b, and 3b and clamps 42 and 43.

The probe 3a is one example of a "first metal plate" as a "signal terminal", and the probes 3b, 3b are examples of a "second metal plate" as a "ground terminal". In the probe apparatus 1 according to the present embodiment, the probe 3a is disposed between the probes 3b, 3b, and the probes 3a, 3b, and 3b are held by the probe holder 4 in a state where the probes 3a, 3b, and 3b are aligned along the plate surface direction sufficiently close to each other (a state where the probes are "adjacently disposed"). Here, in the probe apparatus 1 according to the present embodiment, the probes 3a, 3b, and 3b described above are formed as thin plates using a conductor, such as nickel alloy, by an electroplating process and are capable of elastic deformation along the plate thickness direction. Also, as depicted in FIGS. 3 and 5, a connecting portion 33 that is to be connected to the contact 5a of the connector 5 is provided at a rear end portion 32a of the probe 3a, and a through hole 34 through which a male screw 45, described later, of the probe holder 4 can be inserted is provided at a rear end portion 32b of each probe 3b.

Figure 4:
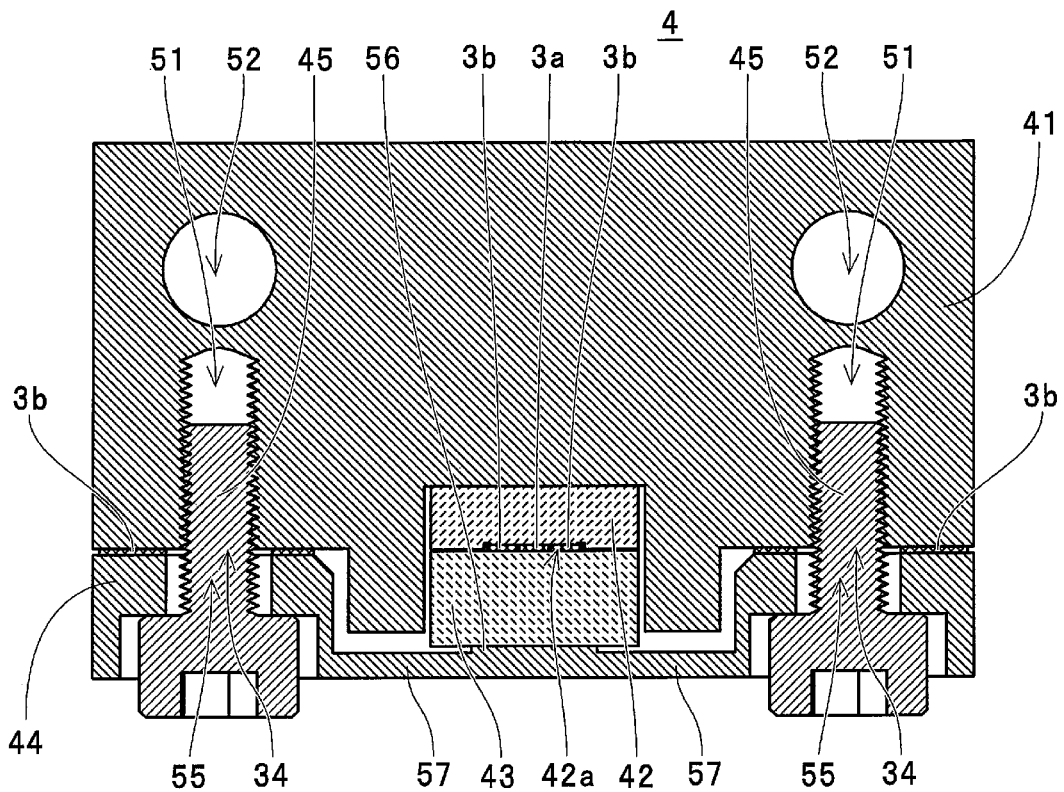
FIG. 4 is a cross-sectional view of a probe holder 4 of the probe apparatus 1.

The probe holder 4 is an example of a "terminal holder" for the present invention and as depicted in FIGS. 3 and 4, is provided with a holder main body 41, clamps 42 and 43, a fixing member 44, and the male screws 45, 45. As depicted in FIGS. 1 and 2, the probe holder 4 is attached to the base 2 by the male screws 11, 11 in a state where the probes 3a, 3b, and 3b have been held. The holder main body 41 is an example of a "holder main body" for the present invention, and in the probe apparatus 1 according to the present embodiment, is formed of a conductor, such as an aluminum alloy or stainless steel. Threaded holes 51, 51 (an example of "female threads provided on the holder main body" for the present invention: see FIG. 4) into which the male screws 45, 45 can be screwed and through holes 52, 52 through which the male screws 11, 11 can be inserted are formed in the holder main body 41.

The clamps 42 and 43 are examples of "a pair of clamps" for the present invention and are formed of a dielectric material, such as crosslinked polystyrene resin or polytetrafluoroethylene. Here, as depicted in FIGS. 4 and 5, a positioning concave 42a, which is one example of a "positioning concave" for the present invention, is formed in the surface of the clamp 42 that faces the clamp 43. The positioning concave 42a is formed so as to be shallower than the thickness of the probes 3a, 3b, and 3b so that the probes 3a, 3b, and 3b can fit in a state where the probes 3a, 3b, and 3b are adjacently disposed as described above.

As depicted in FIGS. 3 and 4, in the probe apparatus 1 according to the present embodiment, as one example, the surface of the clamp 43 that faces the clamp 42 is formed as a flat surface (one example of a configuration where "at least one of the two clamps" refers to only the clamp 42 that is disposed so as to contact the holder main body 41). Here, in the probe apparatus 1 according to the present embodiment, as depicted in FIGS. 1, 2, 10 and 11, a configuration is used where the probes 3a, 3b, and 3b are held in a clamped state between the clamps 42 and 43 with a front end portion 31a (one example of a "part on the front-end side" for the present invention) of the probe 3a and front end portions 31b, 31b (one example of a "part on the front-end side" for the present invention) of the probes 3b, 3b protrude from the clamps 42 and 43.

Figure 6:
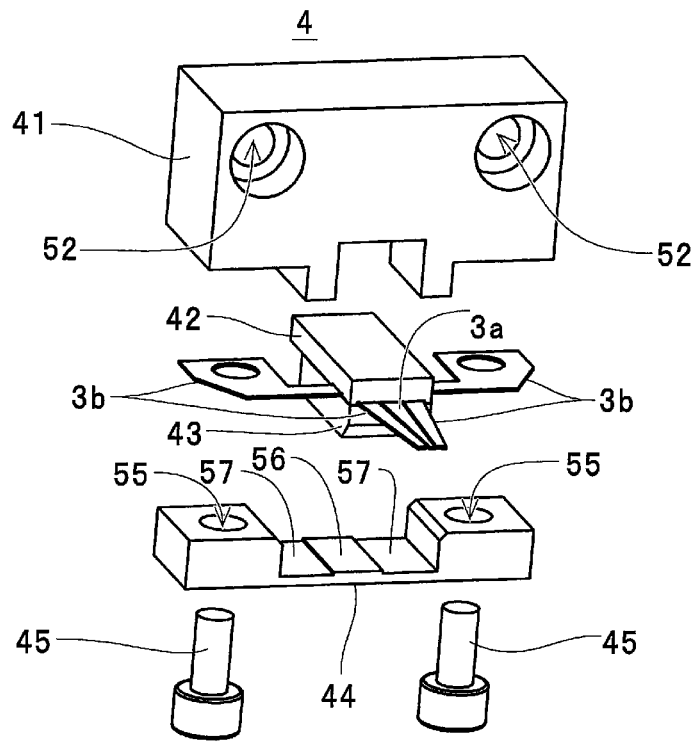
FIG. 6 is an exploded perspective view of the probe holder 4 of the probe apparatus 1.

The fixing member 44 is an example of a "fixing member" for the present invention, and together with the male screws 45, 45, constructs a "fixture" for the present invention. In the same way as the holder main body 41, the fixing member 44 is formed of a conductor, such as an aluminum alloy or stainless steel. Also, as depicted in FIGS. 3, 4 and 6, the fixing member 44 has through holes 55 (one example of "screw insertion portions" for the present invention), through which the male screws 45 can be inserted, formed at both ends in the width direction of the fixing member 44.

Here, with the probe holder 4 in the probe apparatus 1 according to the present embodiment, the male screws 45, 45 that have been inserted through the through holes 55, 55 of the fixing member 44 are screwed into the threaded holes 51, 51 of the holder main body 41, which causes the fixing member 44 to approach the holder main body 41. As a result, the clamps 42 and 43 that clamp the probes 3*a*, 3*b*, and 3*b* are themselves clamped between the holder main body 41 and the fixing member 44, thereby producing a configuration where a stacked structure composed of the clamp 42, the probes 3*a*, 3*b*, and 3*b* and the clamp 43 is fixed by the fixing member 44 so as to be pressed against the bottom surface of the holder main body 41.

Note that the probe apparatus 1 according to the present embodiment is configured so that the parts of the fixing member 44 where the through holes 55 are formed corresponds to the "second part", the part of the fixing member 44 that comes into contact with the clamp 43 (that is, the central portion in the width direction) corresponds to the "first part", a convex portion 56 is provided so that a thickness of "third parts" between the "first part" and the "second parts" (that is, the thickness along the direction in which the male screws 45 are inserted through the through holes 55) is thinner than the thickness of the first part, and a protruding end surface of the convex portion 56 contacts the clamp 43. Also, in the following description, the "third parts" between the "first part" and the "second parts (the part where the convex portion 56 is formed) is also referred to as the "thin portions 57".

The male screws 45, 45 are examples of "male threads" for the present invention, and in the probe apparatus 1 according to the present embodiment are formed of a conductor, such as stainless steel. As described earlier, in the probe apparatus 1 according to the present embodiment, the holder main body 41 and the fixing member 44 are formed of a conductor. Accordingly, with the probe apparatus 1 according to the present embodiment, as will be described later, by screwing the male screws 45, 45, which have been inserted through the through holes 55 of the fixing member 44 and the through holes 34, 34 of the probes 3*b*, 3*b*, into the threaded holes 51, 51 of the holder main body 41 in a state where the rear end portions 32*b*, 32*b* of the probes 3*b*, 3*b* are clamped between the holder main body 41 and the fixing member 44, a state is produced where the holding body 41, the probes 3*b* and 3*b*, the fixing member 44, and the male screws 45, 45 are electrically connected to each other.

Figure 9:
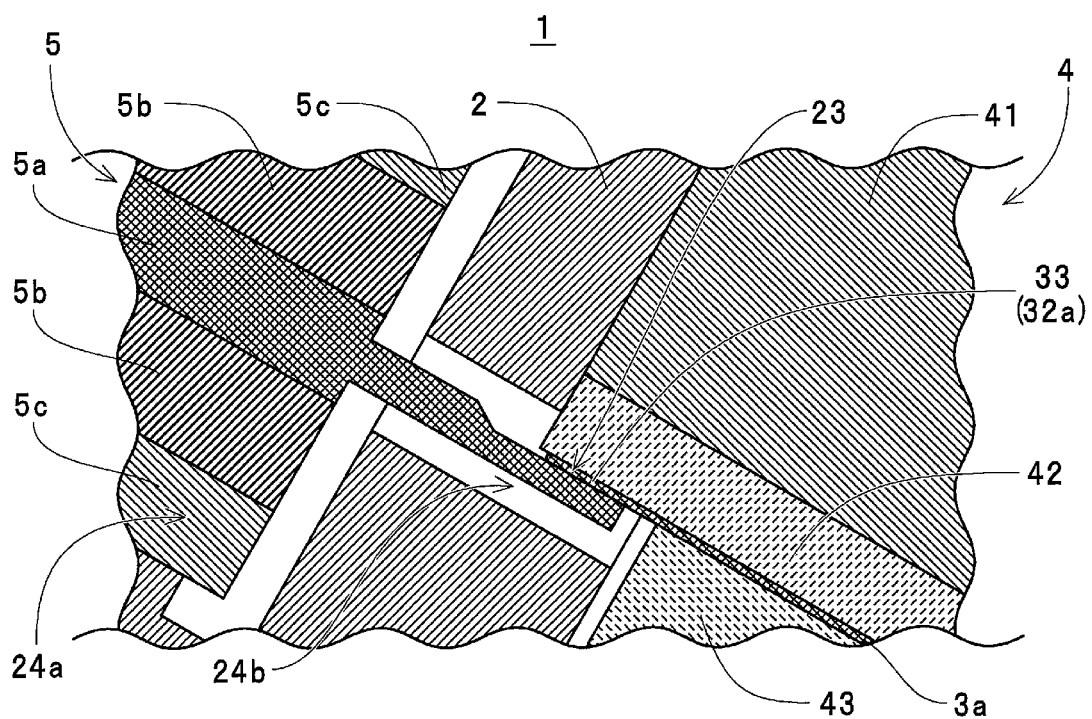
FIG. 9 is a cross-sectional view in which a connected part of a connecting portion 33 (a rear end portion 32a) of the probe 3a and a contact 5a of a connector 5 is enlarged.

The connector 5 is a connector for connecting the probes 3*a*, 3*b*, and 3*b* to a signal cable (coaxial cable) (not illustrated) and, as depicted in FIGS. 3, 8 and 9, includes the contact 5*a*, a dielectric 5*b*, and a body 5*c*. A male thread that can be screwed into a female thread formed in the attachment hole 24*a* in the base 2 is formed on a peripheral surface of the body 5*c*. Although omitted from the drawing and the detailed explanation to facilitate understanding of the configuration of the probe apparatus 1, a spring washer, a shakeproof washer, or the like may be interposed as necessary between the connector 5 and the base 2. When a configuration is used where the probes 3*a*, 3*b*, and 3*b* are directly connected to a measurement circuit (not illustrated) without a signal cable in between, it is also possible to configure the rear end portions 32*a*, 32*b*, and 32*b* of the probes 3*a*, 3*b*, and 3*b* so as to be connectable to a circuit board without the connector 5 being provided.

The stay 6 is a fixing bracket for fixing the probe apparatus 1 to a moving mechanism (or "probing mechanism"), not illustrated, and as depicted in FIG. 3, through holes 61, 61, through which the male screws 12, 12 for fixing the stay 6 to the base 2 are inserted, and through holes 62, 62, through which male screws (not illustrated) for fixing the probe apparatus 1 (that is, the stay 6) to the moving mechanism are formed in the stay 6.

When manufacturing the probe apparatus 1, first, the base 2, the probes 3*a*, 3*b*, and 3*b*, the probe holder 4 (that is, the holder main body 41, the clamps 42 and 43, and the fixing member 44), the stay 6, and the like are individually fabricated. With the probe apparatus disclosed in the patent document cited earlier, it is difficult to select a coaxial cable with an appropriate elastic restoring force out of coaxial cables that have superior high-frequency signal characteristics, and achieving an appropriate level of probing pressure results in a drop in design freedom. Compared to this, with the probe apparatus 1 according to the present embodiment, as described earlier, the probes 3*a*, 3*b*, and 3*b* are formed as thin plates by an electroplating process using nickel alloy or the like, so that by merely performing an electroplating process where the width, length, thickness, and the like of the probes 3*a*, 3*b*, and 3*b* are changed as appropriate in place of the required probing pressure, it is possible to manufacture a probe apparatus 1 capable of achieving an appropriate level of probing pressure. By doing so, there is a sufficient improvement in design freedom.

Next, the connector 5 is attached to the base 2 by screwing the connector 5 (that is, the body 5*c*) into the attachment hole 24*a* of the base 2, the stay 6 is fixed to the base 2 by screwing the male screws 12, 12 that have been inserted through the through holes 61, 61 into the threaded holes 22, 22 of the base 2, and the probes 3*a*, 3*b*, and 3*b* are placed so as to be held by the probe holder 4.

Here, when the probes 3*a*, 3*b*, and 3*b* are held by the probe holder 4, first, the probes 3*a*, 3*b*, 3*b* are aligned along the plate surface direction as depicted in FIGS. 3 and 5 and are fitted in that state into the positioning concave 42*a* of the clamp 42. Next, in a state where the clamp 43 has been disposed facing the clamp 42 so as to clamp the probes 3*a*, 3*b*, and 3*b*, the stacked structure composed of the clamp 42, the probes 3*a*, 3*b*, and 3*b*, and the clamp 43 is disposed at the center in the width direction of a base portion of the holder main body 41. After this, the male screws 45, 45 that have been inserted through the through holes 55, 55 of the fixing member 44 are screwed into the threaded holes 51, 51 of the holder main body 41, thereby making the fixing member 44 approach the holder main body 41.

Figure 7:
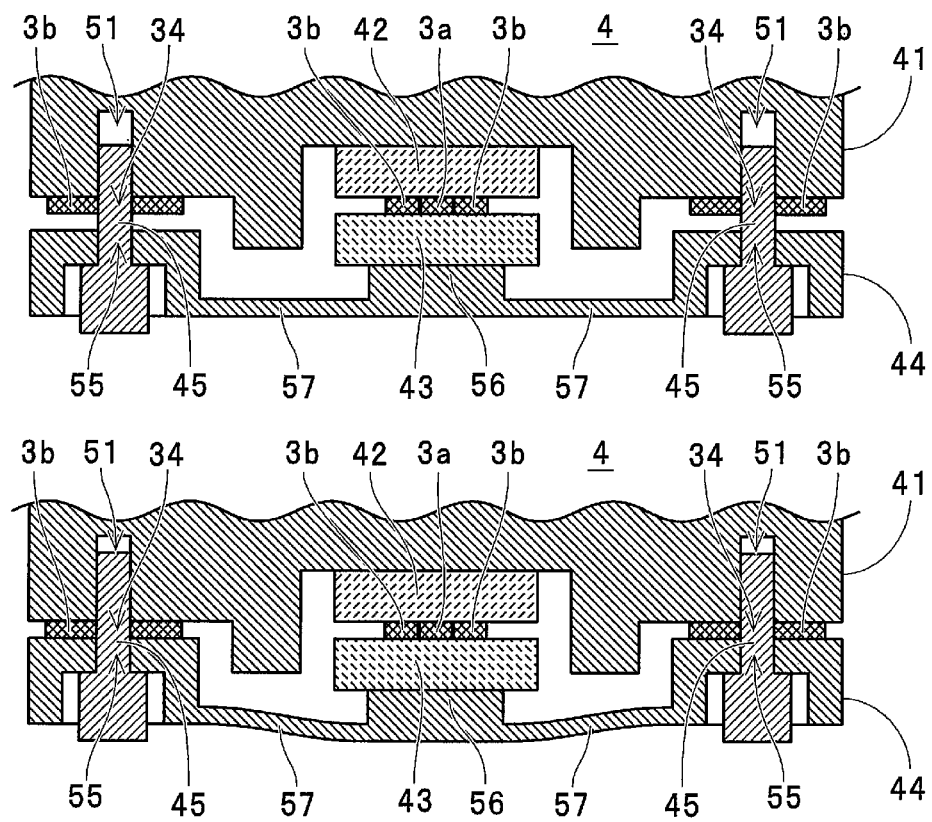
FIG. 7 is a diagram useful in explaining the principle of fixing the probes 3a, 3b, and 3b and the clamps 42 and 43 to a holder main body 41 with a fixing member 44 and male screws 45, 45.

When doing so, a state is produced where the stacked structure composed of the clamp 42, the probes 3*a*, 3*b*, and 3*b*, and the clamp 43 is clamped between the holder main body 41 and the fixing member 44 and where the probes 3*a*, 3*b*, and 3*b* clamped by the clamps 42 and 43 are positioned with respect to the holder main body 41. When the male screws 45, 45 that have been inserted through the through holes 55, 55 of the fixing member 44 have been screwed into the threaded holes 51, 51 of the holder main body 41, the front end of the convex portion 56 of the fixing member 44 will first come into contact with the clamp 43 as the fixing member 44 approaches the holder main body 41, as depicted in the upper drawing in FIG. 7. By further screwing in the male screws 45, 45, as depicted in the lower drawing in FIG. 7, the parts of the fixing member 44 where the through holes 55 are formed will contact the probes 3b, 3b, resulting in the probes 3b, 3b (that is, the rear end portions 32b, 32b) being clamped between the holder main body 41 and the fixing member 44.

Also, with the fixing member 44 of the probe apparatus 1 (the probe holder 4) according to the present embodiment, as described earlier, the convex portion 56 is formed at the part of the fixing member 44 that comes into contact with the clamp 43, and the thin portions 57 (or "third parts") between the convex portion 56 (or "first part") and the parts (or "second parts") where each threaded hole 51 is formed are formed so as to be thinner than the convex portion 56. Accordingly, in a state where the male screws 45, 45 have been sufficiently screwed into the threaded holes 51, 51 until the probes 3b, 3b are clamped between the holder main body 41 and the fixing member 44, as depicted in the lower drawing in FIG. 7, the thin portions 57, 57 of the fixing member 44 slightly deform and the front end of the convex portion 56 is pressed against the clamp 43, thereby favorably avoiding a state where a gap is produced between the fixing member 44 and the clamp 43. Note that the degree of deformation is exaggerated in FIG. 7 to facilitate understanding of how the thin portion 57 deforms. By doing so, the stacked structure composed of the clamp 42, the probes 3a, 3b, and 3b, and the clamp 43 is pressed by the fixing member 44 against the holder main body 41 with a sufficient pressing force, and as depicted in FIG. 4, the holding of the probes 3a, 3b, and 3b by the probe holder 4 is completed.

Next, the probe holder 4 that has held the probes 3a, 3b, and 3b is attached to the base 2. In more detail, a rear end portion of the holder main body 41 of the probe holder 4 is placed in engagement with the stepped portion 23 of the base 2. Here, as depicted in FIGS. 8 and 9, the probe apparatus 1 according to the present embodiment is configured so that when the holder main body 41 has engaged the stepped portion 23, the connecting portion 33 at the rear end portion 32a of the probe 3a clamped by the clamps 42 and 43 is pressed against the contact 5a of the connector 5 that has been attached to the base 2, resulting in the probe 3a being electrically connected to the contact 5a of the connector 5.

Next, the probe holder 4 is fixed to the base 2 by screwing the male screws 11, 11 that have been inserted through the through holes 52, 52 of the holder main body 41 into the threaded holes 21, 21 of the base 2. By doing so, a state is produced where the base 2, the probes 3a, 3b, and 3b, the probe holder 4, the connector 5, and the stay 6 are integrated, and where the holder main body 41 that has been electrically connected to the probes 3b, 3b and the body 5c of the connector 5 that has been attached to the base 2 are electrically connected to each other via the base 2 and the male screws 11, 11. Through the processes described above, a series of assembly operations is completed, and the probe apparatus 1 is completed as depicted in FIGS. 1 and 2.

Figure 10:
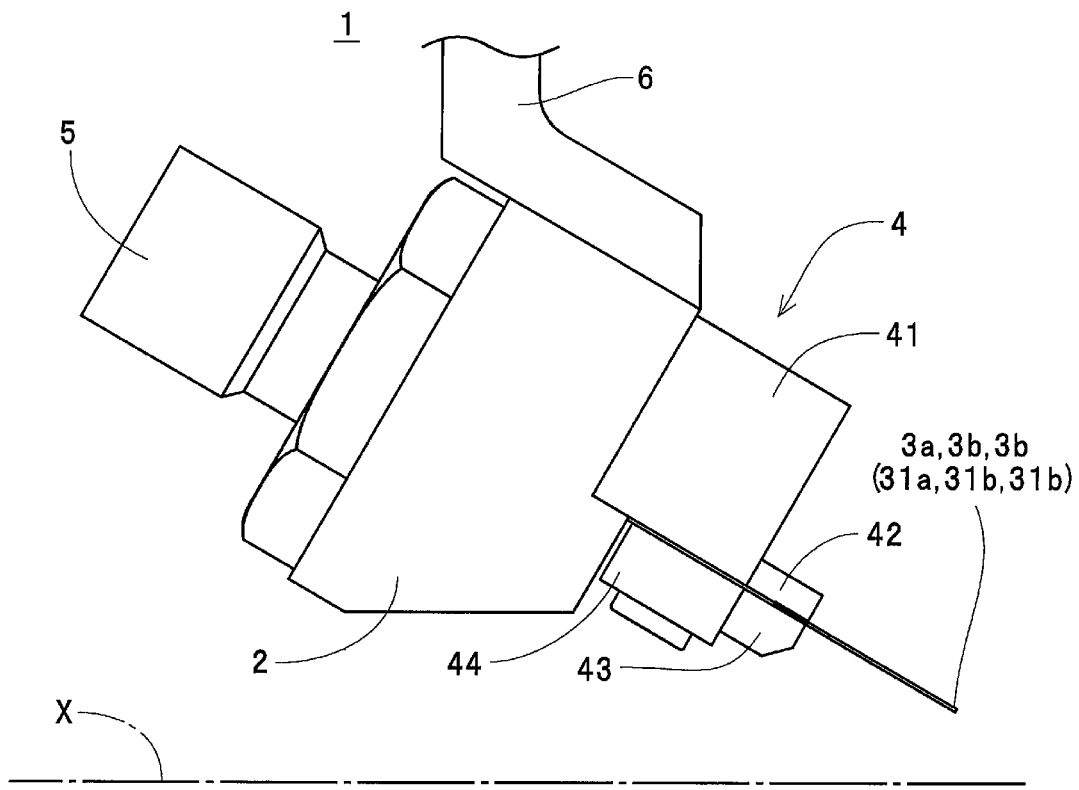
FIG. 10 is a side view of the probe apparatus 1 in a non-probing state.

When measuring the electrical characteristics of a probed object X using the probe apparatus 1, the probe apparatus 1 is attached to a moving mechanism, not illustrated, by screwing male screws that have been inserted through the through holes 62, 62 of the stay 6 into the moving mechanism, and the connector 5 (that is, the contact 5a and the body 5c) of the probe apparatus 1 is connected to the measuring apparatus via a signal cable, not illustrated. Next, when a start of measurement has been indicated, as depicted in FIG. 10, the probe apparatus 1 is moved above the probed object X by the moving mechanism and the probe apparatus 1 is then caused to approach the probed object X so that the front end portions 31a, 31b, 31g of the respective probes 3a, 3b, and 3b probe the probed object X as depicted in FIG. 11.

Figure 11:
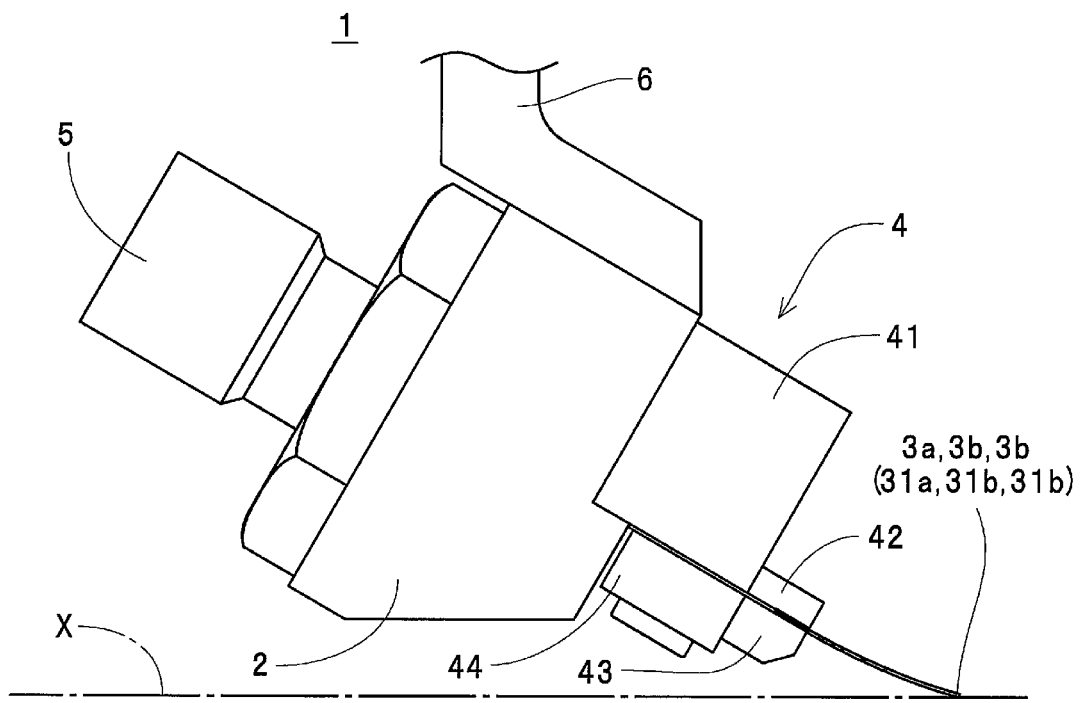
FIG. 11 is a side view of the probe apparatus 1 in a probing state.

At this time, as depicted in FIG. 11, the parts at the front-end portion 31a, 31b, 31b sides of the probes 3a, 3b, and 3b that protrude from the clamps 42 and 43 of the probe holder 4 elastically deform along the plate thickness direction of the probes 3a, 3b, and 3b, and due to the elastic restoring force, the front end portions 31a, 31b, and 31b are pressed against the probed object X with a sufficient pressing force.

Here, in the probe apparatus 1, the parts at the front-end portion 31a, 31b, and 31b sides of the probes 3a, 3b, and 3b that protrude from the two clamps 42 and 43 of the probe holder 4 elastically deform without touching any part of the probe holder 4 during probing. Accordingly, since only an elastic restoring force, which changes according to the degree of elastic deformation of the respective probes 3a, 3b, and 3b, acts as the probing pressure, there is no sudden change in the probing pressure during probing. As a result, the respective probes 3a, 3b, and 3b can favorably probe the probed object X with the desired probing pressure.

Also, in the probe apparatus 1, at parts of the probes 3a, 3b, and 3b aside from the parts at the front-end portion 31a, 31b, and 31b sides that protrude from both clamps 42 and 43 of the probe holder 4 (in the present embodiment, the connecting portion 33 of the rear end portion 32a of the probe 3a and the vicinity of the through holes 34 in the rear end portions 32b of the probes 3b), the probes 3a, 3b, and 3b are connected to a "conductor portion at signal potential" (that is, the contact 5a of the connector 5) and a "conductor portion at ground potential" (the holder main body 41, the fixing member 44, or the like), respectively. By doing so, the probe apparatus 1 is configured so that there are no soldered parts at the positions where the probes 3a, 3b, and 3b elastically deform during probing.

In this way, in the probe apparatus 1, the probe holder 4 includes: a holder main body 41 formed of a conductor; a pair of clamps 42 and 43 that are formed of a dielectric and are capable of clamping the probe 3a (or a "first metal plate" as the "signal terminal") and the probes 3b, 3b (or a "second metal plate" as the "ground terminal"); and the "fixture (in the present embodiment, the fixing member 44 and the male screws 45, 45))" that is capable of fixing the clamps 42 and 43 to the holder main body 41 in a state where the probes 3a, 3b, 3b are clamped. The probe holder 4 is configured so that the probes 3a, 3b, 3b are clamped by the two clamps 42 and 43 in a state where the probes 3a, 3b, 3b have been aligned along the plate surface direction, the front-end portions 31a, 31b, and 31b protrude from the clamps 42 and 43, and the front end portions 31a, 31b, and 31b are capable of elastic deformation along the plate thickness direction.

Accordingly, since the probe apparatus 1 is configured with no soldering at the parts of the probes 3a, 3b, and 3b where the probing pressure acts, it is possible to make the service life sufficiently longer, and since variations in the electrical characteristics do not occur due to differences in the amount of flux, the amount of solder material, the temperature during the soldering process, and the like, it is possible to make accurate measurements of the measured amount. Also, by changing any of the width, length, and thickness of the probes 3a, 3b and 3b, it is possible to produce a structure with an elastic restoring force capable of achieving the appropriate probing pressure, which results in a sufficient improvement in design freedom. In addition, since the parts of the probes 3a, 3b, and 3b that elastically deform during probing do not contact the probe holder 4, there is no sudden change in the elastic restoring force during elastic deformation, which means it is possible to sufficiently reduce variations in the probing pressure. As a result, it is possible to perform probing with an appropriate level of probing pressure reliably and easily.

In addition, the probe apparatus 1 is configured so that the "fixture" includes the fixing member 44 formed of a conductor and two male screws 45, 45 that are formed of a conductor. By screwing the male screws 45, 45, which have been inserted through the through holes 55, 55 formed in the fixing member 44, into the threaded holes 51, 51 provided in the holder main body 41, it is possible to press and fix the clamps 42 and 43, which have clamped the probes 3*a*, 3*b*, and 3*b* onto the holder main body 41 using the fixing member 44.

Thus, according to the probe apparatus 1, since the holder main body 41 and the fixing member 44 can be electrically connected to each other while fixing the fixing member 44 to the holder main body 41 with the male screws 45, 45, without separately providing wiring or the like for connecting the holder main body 41 and the fixing member 44 to each other in order to set the holder main body 41 and the fixing member 44 at the ground potential, it is possible to sufficiently lower the assembly cost and the component cost of the probe apparatus 1.

Also, according to the probe apparatus 1, the probes 3*b*, 3*b* are clamped between the holder main body 41 and the fixing member 44, which electrically connects the probes 3*b* and 3*b*, the holder main body 41, and the fixing member 44 to each other. This means that the fixing member 44 can be fixed to the holder main body 41 by the male screws 45, 45 and the holder main body 41, the probes 3*b*, 3*b*, and the male screws 45 can be electrically connected to each other without separately providing wiring or the like to electrically connect the probes 3*b*, 3*b* to the holder main body 41 and/or the fixing member 44, which makes it possible to significantly reduce the assembly cost and component cost of the probe apparatus 1.

Also according to the probe apparatus 1, the fixing member 44 is configured so that "second parts" are provided at at least two positions on both sides of the "first part" (i.e., the position where the convex portion 56 is formed) that is placed in contact with the clamps 42 and 43, the through holes 55 are formed at both "second parts", and the "third parts (the thin portions 57)" between the "first part" and the "second parts" are formed so that the thickness along the insertion direction of the male screws 45, 45 into the through holes 55, 55 is thinner than the thickness of the "first part" along the insertion direction. With this configuration, the convex portion 56 can be pressed against the clamp 43 with sufficient force by the elastic restoring force of the thin portions 57, 57 that elastically deform due to the male screws 45, 45 being screwed in. As a result, the probes 3*a*, 3*b*, 3*b* can be securely clamped by the clamps 42 and 43, and the stacked structure composed of the clamp 42, the probes 3*a*, 3*b*, and 3*b*, and the clamp 43 can be reliably fixed to the holder main body 41.

In addition, according to the probe apparatus 1, by forming a positioning concave 42*a*, which is shallower than the thickness of the probes 3*a*, 3*b*, and 3*b*, in the clamp 42 and fitting and positioning the probes 3*a*, 3*b*, and 3*b* into the positioning concave 42*a*, it is possible to favorably avoid unintended misalignment of the probes 3*a*, 3*b*, and 3*b* with respect to the clamp 42.

Also, according to the probe apparatus 1, by providing two probes 3*b*, 3*b* that correspond to the "second metal plate" for the present invention and disposing the probe 3*a* between the two probes 3*b*, 3*b*, compared to a configuration with one "signal terminal" and one "ground terminal", it is possible to shield the "signal terminal" using the respective "ground terminals", which makes it possible to sufficiently improve the high-frequency signal characteristics of the probe apparatus 1.

Note that the configuration of a "probe apparatus" for the present invention is not limited to the example configuration of the probe apparatus 1 described above. As one example, although the probe apparatus 1 with two probes 3*b* corresponding to a "second metal plate as a ground terminal" has been described as an example, it is also possible to construct a "probe apparatus" that is equipped with one "first metal plate as a signal terminal" and one "second metal plate as a ground terminal".

Also, although an example in which the "fixture" for the present invention is constructed of the fixing member 44 and the male screws 45, 45 has been described, in place of this configuration, as one example, it is also possible to use a configuration (not illustrated) where the clamp 43 and the fixing member 44 in the probe apparatus 1 are integrally formed of a dielectric to construct "one out of a pair of clamps", the "fixture" is constructed of the male screws 45, 45 only, and the male screws 45, 45 are inserted through "screw insertion portions" (similar elements to the through holes 55, 55 of the fixing member 44 in the probe apparatus 1) provided in the "one out of the pair of clamps" described above and screwed into the threaded holes 51, 51 of the holder main body 41.

In addition, in place of a configuration where the threaded holes 51, 51 provided in the holder main body 41 function as "female threads" and the male screws 45, 45 are screwed in, it is also possible to use a configuration (not illustrated) where a "male thread" such as the male screws 45, 45 is screwed in with a "nut" provided on the "holder main body" as the "female thread". Also, in place of a "male thread" such as the male screws 45, 45, it is possible to construct the "fixture" of a U-shaped clip that is capable of clamping the "holder main body" and the "fixing member" (or the "one out of the pair of clamps" described above) (not illustrated). In this case, the number of "male threads" and/or "clips" is not limited to two, and can be any arbitrary number that is three or higher. Similarly, the number of "female threads" can be any arbitrary number that is three or higher in keeping with the number of "male threads".

Additionally, when constructing "the fixing member", "notches" and/or "slits" of various shapes can be provided as "screw insertion portions" in place of the "through holes 55". Although an example configuration of the probe apparatus 1 has been described where the male screws 45, 45 that have been inserted through the through holes 55, 55 of the fixing member 44 and the through holes 34, 34 of the probes 3*b* and 3*b* are screwed into the threaded holes 51, 51 of the holder main body 41 to electrically connect the fixing member 44, the probes 3*b*, 3*b*, and the holder main body 41 to each other, it is also possible to separately provide wiring that electrically connects the "second metal plate as a ground terminal" to the "holder main body" and/or the "fixing member".

Also, although an example configuration has been described where one of the clamps 42 and 43 (in this example, the clamp 42) corresponding to the "pair of clamps" for the present invention is provided with the positioning concave 42*a* as one example of a "positioning concave" for the present invention, in place of (or in addition to) this configuration, it is also possible to use a configuration where a "positioning concave" is provided in a "clamp" that corresponds to the clamp 43 in the probe apparatus 1. In this case, when "positioning concaves" are formed in both of the "pair of clamps", it is necessary to form the "positioning concaves" so that the total depth of the two "positioning concaves" is less than the thickness of the "first metal plate" and/or the "second metal plate" so that the two "clamps" do not directly contact each other when the "first metal plate" and the "second metal plate" are clamped.

INDUSTRIAL APPLICABILITY

Reference Signs List

1 Probe apparatus
2 Base
3a, 3b, 3b Probe
4 Probe holder
5 Connector
6 Stay
11, 12, 45 Male screw
21, 22, 51 Threaded hole
24a Attachment hole
24b, 34, 52, 55, 61, 62 Through hole
31a, 31b Front end portion
32a, 32b Rear end portion
33 Connecting portion
41 Holder main body
42, 43 Clamp
42a Positioning concave
44 Fixing member
56 Convex portion
57 Thin portion
X Probed object

The invention claimed is:

1. A probe apparatus in which a signal terminal and a ground terminal are held by a terminal holder in a state where the signal terminal and the ground terminal are adjacently disposed, the probe apparatus comprising:
a first metal plate as the signal terminal; and
a second metal plate as the ground terminal,
wherein the terminal holder includes:
a holder main body that is formed of a conductor;
a pair of clamps that are formed of a dielectric and are capable of clamping the first metal plate and the second metal plate; and
a fixture capable of fixing both clamps, in a state where the first metal plate and the second metal plate have been clamped, to the holder main body,
the first metal plate and the second metal plate are clamped by both clamps in a state where the first metal plate and the second metal plate have been aligned along a plate surface direction,
parts on front-end sides of the first metal plate and the second metal plate protrude from both clamps, and
the parts on the front-end sides are capable of elastic deformation along a plate thickness direction.

2. The probe apparatus according to claim 1, comprising two second metal plates, with the first metal plate disposed between the two second metal plates.

3. The probe apparatus according to claim 1, wherein a positioning concave, which is shallower than a thickness of the first metal plate and the second metal plate, is formed in at least one of the clamps, and
the first metal plate and the second metal plate are fitted into and positioned by the positioning concave.

4. The probe apparatus according to claim 3, comprising two second metal plates, with the first metal plate disposed between the two second metal plates.

5. The probe apparatus according to claim 1,
wherein the fixture includes a fixing bracket formed of a conductor and at least two male threads formed of a conductor,
and by screwing the male threads, which have been inserted through thread insertion portions formed in the fixing bracket, into female threads provided on the holder main body, both clamps, which have clamped the first metal plate and the second metal plate, are pressed against and fixed to the holder main body by the fixing bracket.

6. The probe apparatus according to claim 5, comprising two second metal plates, with the first metal plate disposed between the two second metal plates.

7. The probe apparatus according to claim 5, wherein a positioning concave, which is shallower than a thickness of the first metal plate and the second metal plate, is formed in at least one of the clamps, and
the first metal plate and the second metal plate are fitted into and positioned by the positioning concave.

8. The probe apparatus according to claim 7, comprising two second metal plates, with the first metal plate disposed between the two second metal plates.

9. The probe apparatus according to claim 5, wherein the fixing bracket is provided, at at least two positions, with second parts located on both sides of a first part that is placed into contact with the clamps, has a thread insertion portion formed in each second part, and a thickness, along an insertion direction of the male thread into the thread insertion portions, of third parts located between the first part and the second parts is formed thinner than a thickness of the first part along the insertion direction.

10. The probe apparatus according to claim 9, comprising two second metal plates, with the first metal plate disposed between the two second metal plates.

11. The probe apparatus according to claim 9, wherein a positioning concave, which is shallower than a thickness of the first metal plate and the second metal plate, is formed in at least one of the clamps, and
the first metal plate and the second metal plate are fitted into and positioned by the positioning concave.

12. The probe apparatus according to claim 11, comprising two second metal plates, with the first metal plate disposed between the two second metal plates.

13. The probe apparatus according to claim 5, wherein the second metal plate is clamped between the holder main body and the fixing bracket, and
the second metal plate, the holder main body, and the fixing bracket are electrically connected to each other.

14. The probe apparatus according to claim 13, comprising two second metal plates, with the first metal plate disposed between the two second metal plates.

15. The probe apparatus according to claim 13, wherein a positioning concave, which is shallower than a thickness of the first metal plate and the second metal plate, is formed in at least one of the clamps, and
the first metal plate and the second metal plate are fitted into and positioned by the positioning concave.

16. The probe apparatus according to claim 15, comprising two second metal plates, with the first metal plate disposed between the two second metal plates.

17. The probe apparatus according to claim 13, wherein the fixing bracket is provided, at at least two positions, with second parts located on both sides of a first part that is placed into contact with the clamps, has a thread insertion portion formed in each second part, and a thickness, along an insertion direction of the male thread into the thread insertion portions, of third parts located between the first part and the second parts is formed thinner than a thickness of the first part along the insertion direction.

18. The probe apparatus according to claim 17, comprising two second metal plates, with the first metal plate disposed between the two second metal plates.

19. The probe apparatus according to claim 17, wherein a positioning concave, which is shallower than a thickness of the first metal plate and the second metal plate, is formed in at least one of the clamps, and the first metal plate and the second metal plate are fitted into and positioned by the positioning concave.

20. The probe apparatus according to claim 19, comprising two second metal plates, with the first metal plate disposed between the two second metal plates.

* * * * *